United States Patent
Furuta et al.

(10) Patent No.: US 7,972,470 B2
(45) Date of Patent: Jul. 5, 2011

(54) ASYMMETRIC GROUNDING OF RECTANGULAR SUSCEPTOR

(75) Inventors: Gaku Furuta, Sunnyvale, CA (US); Soo Young Choi, Fremont, CA (US); Young-Jin Choi, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 944 days.

(21) Appl. No.: 11/775,359

(22) Filed: Jul. 10, 2007

(65) Prior Publication Data
US 2008/0274297 A1    Nov. 6, 2008

Related U.S. Application Data

(60) Provisional application No. 60/915,833, filed on May 3, 2007.

(51) Int. Cl.
*H01L 21/306* (2006.01)
*C23C 16/00* (2006.01)
(52) U.S. Cl. ............. 156/345.47; 118/723 E; 118/723 R
(58) Field of Classification Search .............. 118/723 R, 118/723 E, 723 ER; 156/345.43, 345.44, 156/345.46, 345.47
See application file for complete search history.

(56) References Cited

U.S. PATENT DOCUMENTS

| 6,024,044 | A | 2/2000 | Law et al. ..................... 118/723 |
| 6,857,387 | B1 | 2/2005 | Sun et al. |
| 7,083,702 | B2 | 8/2006 | Blonigan et al. |
| 2005/0255255 | A1* | 11/2005 | Kawamura et al. ........... 427/569 |
| 2006/0060302 | A1* | 3/2006 | White et al. ............. 156/345.28 |

FOREIGN PATENT DOCUMENTS
JP    8-306670    11/1996
* cited by examiner

*Primary Examiner* — Luz L. Alejandro
(74) *Attorney, Agent, or Firm* — Charles S. Guenzer

(57) ABSTRACT

An asymmetrically grounded susceptor used in a plasma processing chamber for chemical vapor deposition onto large rectangular panels supported on and grounded by the susceptor. A plurality of grounding straps are connected between the periphery of the susceptor to the grounded vacuum chamber to shorten the grounding paths for RF electrons. Flexible straps allow the susceptor to vertically move. The straps provide a conductance to ground which is asymmetric around the periphery. The straps may be evenly spaced but have different thicknesses or different shapes or be removed from available grounding point and hence provide different RF conductances. The asymmetry is selected to improve the deposition uniformity and other qualities of the PECVD deposited film.

37 Claims, 13 Drawing Sheets

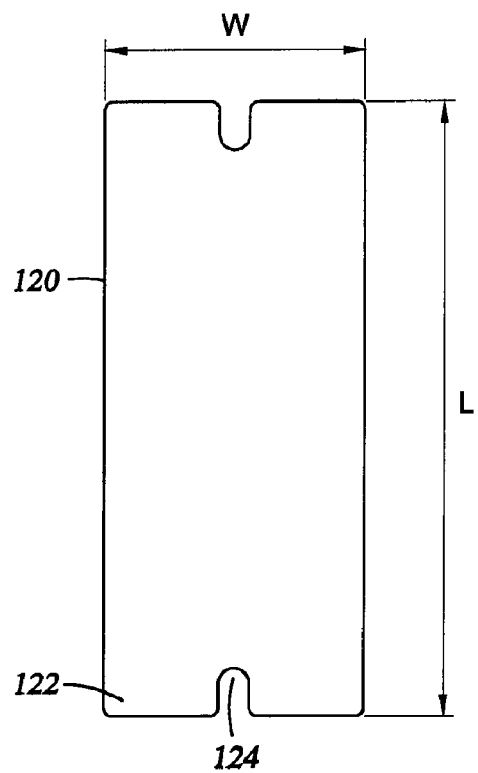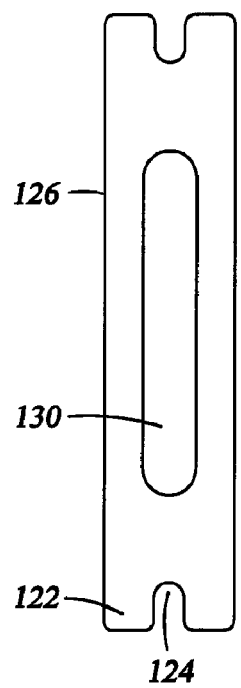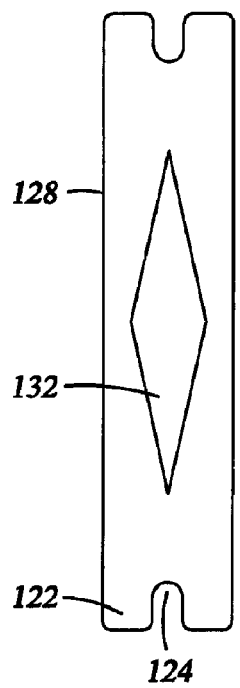
*Fig. 7*   *Fig. 8*   *Fig. 9*
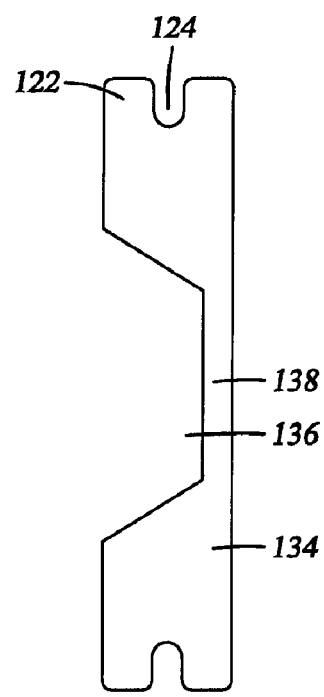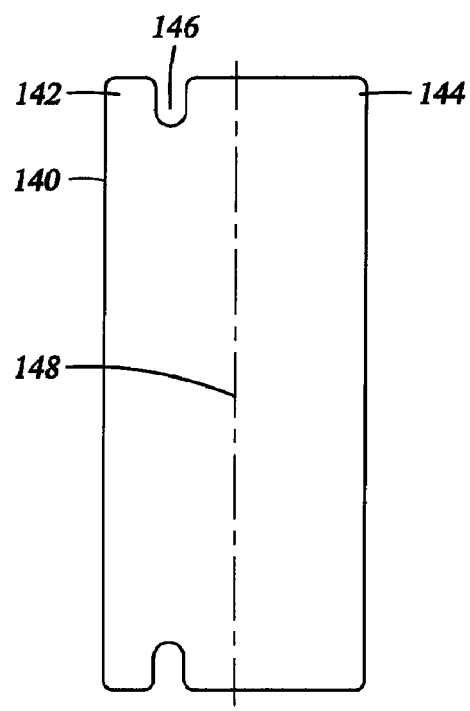
*Fig. 10*   *Fig. 11*

|  |  |  |
|---|---|---|
| 14.9 / 18.0 / 9.5 | - / 9.9 / 10.0 | Si-H% |
| - / 17.2 / 13.1 | 14.9 / 13.4 / 14.1 | - / 12.1 / 19.9 |
|  | - / 11.9 / 13.4 | 14.0 / 11.3 / 14.6 |

W (left) ... S/V (right)

Fig. 17

STRESS

|  |  |  |
|---|---|---|
| 3.7 / 3.6 / -2.1 | - / -1.5 / -0.3 | STRESS |
| 4.5 / 0.0 | 3.0 / 0.9 / -0.7 | - / -0.2 / 5.5 |
|  | - / -1.3 / -1.7 | 3.3 / -0.6 / -2.9 |

W (left) ... S/V (right)

Fig. 18

WER

|  |  |  |
|---|---|---|
| 1730 / 1728 / 529 | - / 634 / 1141 | WER |
| - / 2521 / 557 | 1230 / 931 / 660 | - / 780 / 1254 |
|  | - / 582 / 495 | 1350 / 704 / 675 |

W (left) ... S/V (right)

US 7,972,470 B2

ASYMMETRIC GROUNDING OF RECTANGULAR SUSCEPTOR

RELATED APPLICATION

This application claims benefit of provisional application 60/915,833, filed May 3, 2007.

FIELD OF THE INVENTION

The invention relates generally to plasma processing of materials. In particular, the invention relates to electrical connections to a large rectangular susceptor.

BACKGROUND ART

Many of the fabrication techniques developed for manufacturing integrated circuits on silicon wafers have been adapted to fabricating displays and other circuits on large flat panels of glass and other material. The flat panel may be formed into computer or television displays. More recently, interest has arisen in using the same type of equipment for fabricating thin-film solar cells. Flat panel fabrication equipment has long been distinguished from wafer fabrication equipment by the size and the rectangular shape of the panels. Some of the earliest flat panels had a size of about 500 mm on a side, but there has been a continuing trend to larger panels. Some of the most recent equipment process panels of size 2200 mm×2500 mm versus the current generation of 300 mm circular wafers. This generation of equipment is accordingly referred to as 55K because the panels have a total area of 55,000 $cm^2$. Yet larger panels are being contemplated.

One of the important techniques used in fabricating panels displays is plasma enhanced chemical vapor deposition (PECVD), which is used to deposit the semiconducting layer of typically amorphous hydrogenated silicon and an insulating layer typically of amorphous hydrogenated silicon nitride. The amorphous silicon may be doped to either conductivity type in order to form the p-n junction required in transistors or solar cells. The process may also be used to deposit layers of silicon oxide and other materials. The quality and uniformity of these layers, particularly the silicon and silicon nitride layers, are important in commercial operation.

SUMMARY OF THE INVENTION

The susceptor supporting a substrate to be coated with a film in a process of chemical vapor deposition is asymmetrically grounded at its periphery, for example, to the walls of the vacuum chamber. The grounding may be accomplished by a plurality of electrical straps differing in their RF conductance or in their distribution around the susceptor periphery.

The invention is particular useful for rectangular susceptors of large size, for example, above 1 m, with RF power supplied to an opposing excitation electrode at a relatively high frequency, for example 13.56 MHz or above.

The ground straps may have different shapes resulting in different RF conductance even though the straps are connected with equal spacing on the susceptor periphery or grounding points which are equally distributed on the susceptor periphery may be only partially populated with ground straps.

The asymmetry of the grounding may be selected to improve the uniformity of deposition rate across the substrate. The asymmetry may also improve other film qualities and their uniformity, such as the concentration of silicon-hydrogen bonds in amorphous SiN:H, stress, or wet etch rate.

According to one design rule, a higher strap conductance is added to the side opposite the side exhibiting low deposition rate.

BRIEF DESCRIPTION OF THE DRAWINGS

FIGS. 7 through 11 are plan views of different shapes and sizes of ground straps usable with the invention.

FIGS. 16-18 are maps illustrating the distribution around the panel of respectively the fraction of silicon-hydrogen bonds in hydrogenated silicon nitride, the stress, and the wet etch rate for the three grounding configurations of FIGS. 12-14.

DETAILED DESCRIPTION OF THE PREFERRED EMBODIMENTS

A typical deposition chamber for plasma enhanced chemical vapor deposition (PECVD) includes a showerhead electrode in close proximity to a grounded susceptor supporting the panel being coated. A process gas such as silane ($SiH_4$) and hydrogen ($H_2$) for depositing silicon is supplied through a large number of apertures in the wide showerhead to evenly distribute the CVD precursor gas to the processing space above the panel. An alternative mixture of precursor gases for depositing silicon nitride is silane, ammonia ($NH_3$) and nitrogen ($N_2$). An RF power supply, for example, operating at 13.56 MHz, is connected to the showerhead electrode to excite the processing gas into a plasma and promote the chemical vapor deposition of silicon onto the substrate. The grounded susceptor acts as a counter electrode to the RF biased showerhead electrode. The susceptor may be connected to a lift mechanism through a stem to allow an external robot to transfer the panel onto the susceptor but then to raise the panel closer to the showerhead.

The grounding of the susceptor is most easily accomplished by grounding the stem around its connection to the external lift mechanism. However, Law et al. have recognized in U.S. Pat. No. 6,024,044 that film quality is improved by multiple grounding paths at the periphery of the susceptor.

The precise theory underlying the need for peripheral grounding is complex and only now being developed. At the more fundamental level, peripheral grounding is necessitated by the skin effect in the metal susceptor. According to the well known skin effect, a high-frequency radiation field can penetrate only a short distance into a highly conductive metal. Instead the electrical field falls off according to an exponential function $$e^{-t/\delta}$$

of the depth t into the metal, where δ is the skin depth, which in a non-magnetic material may be calculated as $$\delta = \sqrt{\frac{\rho}{\pi \mu c f}},$$

where ρ is the resistivity of the metal, μ is the permeability constant, c is the speed of light, and f is the frequency of the electromagnetic radiation. For an aluminum resistivity of $2.8 \times 10^{-6}$ ohm-cm and an RF frequency of 13.56 MHz, the skin depth is about 31 microns, a distance far less than the thickness of a typical susceptor. Yet higher RF frequencies are being contemplated because of increased deposition rates, but the skin depth accordingly decreases and related grounding effects intensify. We have found that deposition non-uniformity worsens with larger panels.

Figure 1:
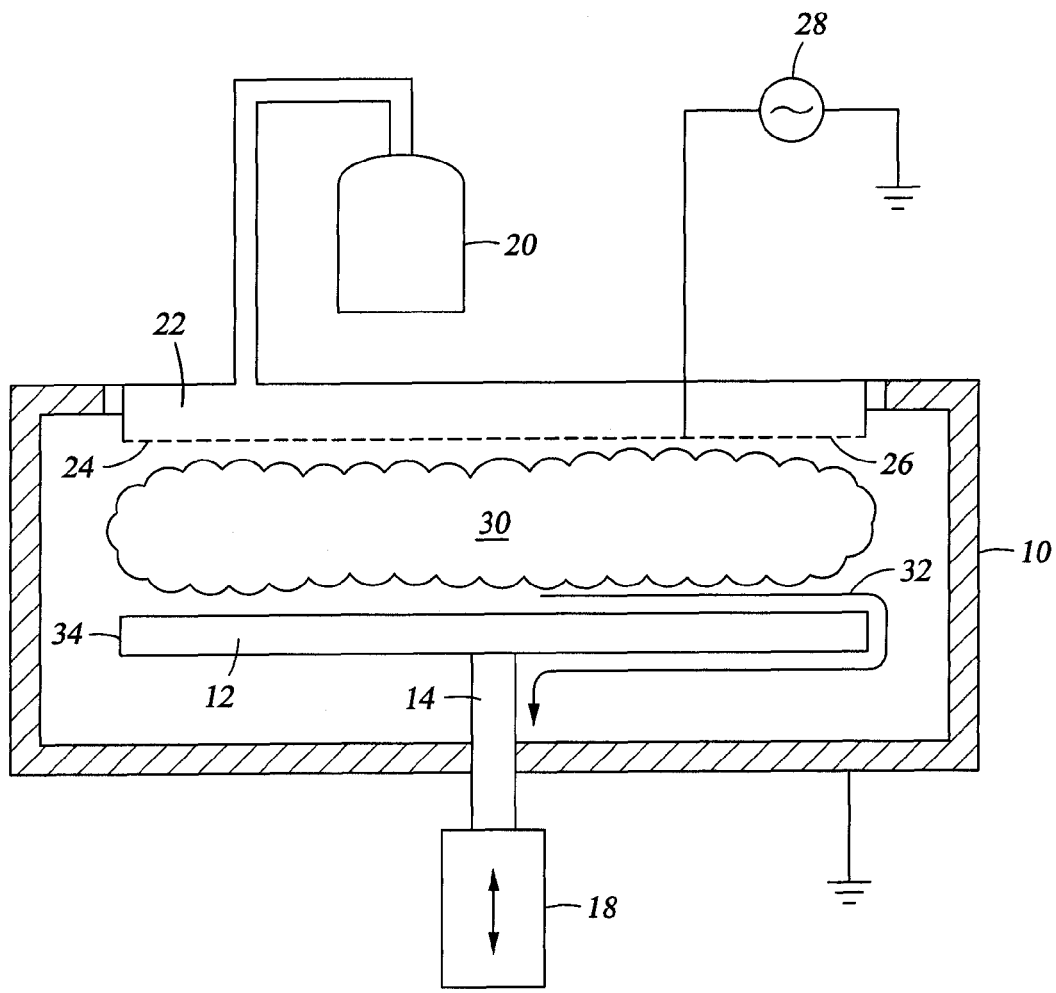
FIG. 1 is a cross-sectional view of a schematic representation of a plasma processing chamber used for chemical vapor deposition illustrating the effect of grounding the susceptor at a single point.

The effects of the metallic skin depth are illustrated for a plasma process chamber in the schematic diagram of FIG. 1. A vacuum chamber 10 is electrically grounded and encloses a susceptor 12 supporting an unillustrated substrate. The susceptor 12 is electrically grounded to the vacuum chamber 10 through a stem 14 connected to an external vertical lift mechanism 16. In view of the large size and weight of the susceptor 12, multiple stems operating in synchronism may be distributed at the back of the susceptor 12. A gas source 20 supplies process gas to a manifold 22 in back of a gas distribution plate or showerhead 24 containing a large number of distributed gas holes 26 to evenly distribute the process gas to a processing space between the showerhead 24 and the susceptor 12. The drawing exaggerates the height of the processing space, which is typically much shallower than it is wide. The showerhead 24 is electrically conductive to act as an electrode and is electrically isolated from the vacuum chamber 10. An RF power supply 28 is connected to the showerhead 24 to excite the processing gas into an RF plasma 30 between the showerhead 24 and the susceptor 12.

In generating the RF plasma 30, a large number of RF electrons are grounded to the metallic susceptor 12, typically composed of aluminum. However, because of the skin effect, the RF electrons cannot penetrate directly through the relatively thick susceptor 12 but instead flow in a thin surface layer along a circuitous path 32 to a periphery 34 of the susceptor 12, down its side, and then back inwardly toward the stem 14. This thickness of the surface layer through which the RF grounding current flows may be approximated by the skin depth, that is, 31 micrometers in aluminum. The long thin circuitous path 32 introduces a number of possible problems. If the path 32 is comparable to the RF wavelength, a standing wave may develop. There is capacitive coupling between the grounded vacuum chamber 10 and a periphery 34 and the bottom of the susceptor 12. The capacitive coupling presents a particularly severe problem at the susceptor periphery 34 when there is a significant impedance to ground from that point since a plasma discharge may occur between the periphery 34 and the chamber wall and rob power from the plasma 30 between the susceptor 10 and the showerhead 24. Further, the long path 32 introduces inductance in the grounding path.

Recent theories have emphasized the radial conduction through the plasma 30, which exhibits even greater skin effects because of the lower wave velocity in a plasma. Examples of papers in this area include Lieberman et al., "Standing wave and skin effects in large-area, high-frequency capacitive discharges," *Plasma Sources Science and Technology*, vol. 11, pp. 283-293 (2002) and Chabert et al., "Inductive heating and E to H transitions in high frequency capacitive discharges," ibid., vol. 15, pp. S130-S136 (2006).

Blonigan et al. have recently described in U.S. Pat. No. 7,083,702, incorporated herein by reference, the desirability of larger and more numerous peripheral grounding paths for the increasingly larger susceptors. A 55K PECVD chamber may include a total of 50 or more ground straps evenly distributed around the periphery of the susceptor and flexibly connected to the bottom of the vacuum chamber. However, problems in uniformity and film quality still persist and need to be addressed.

Figure 2:
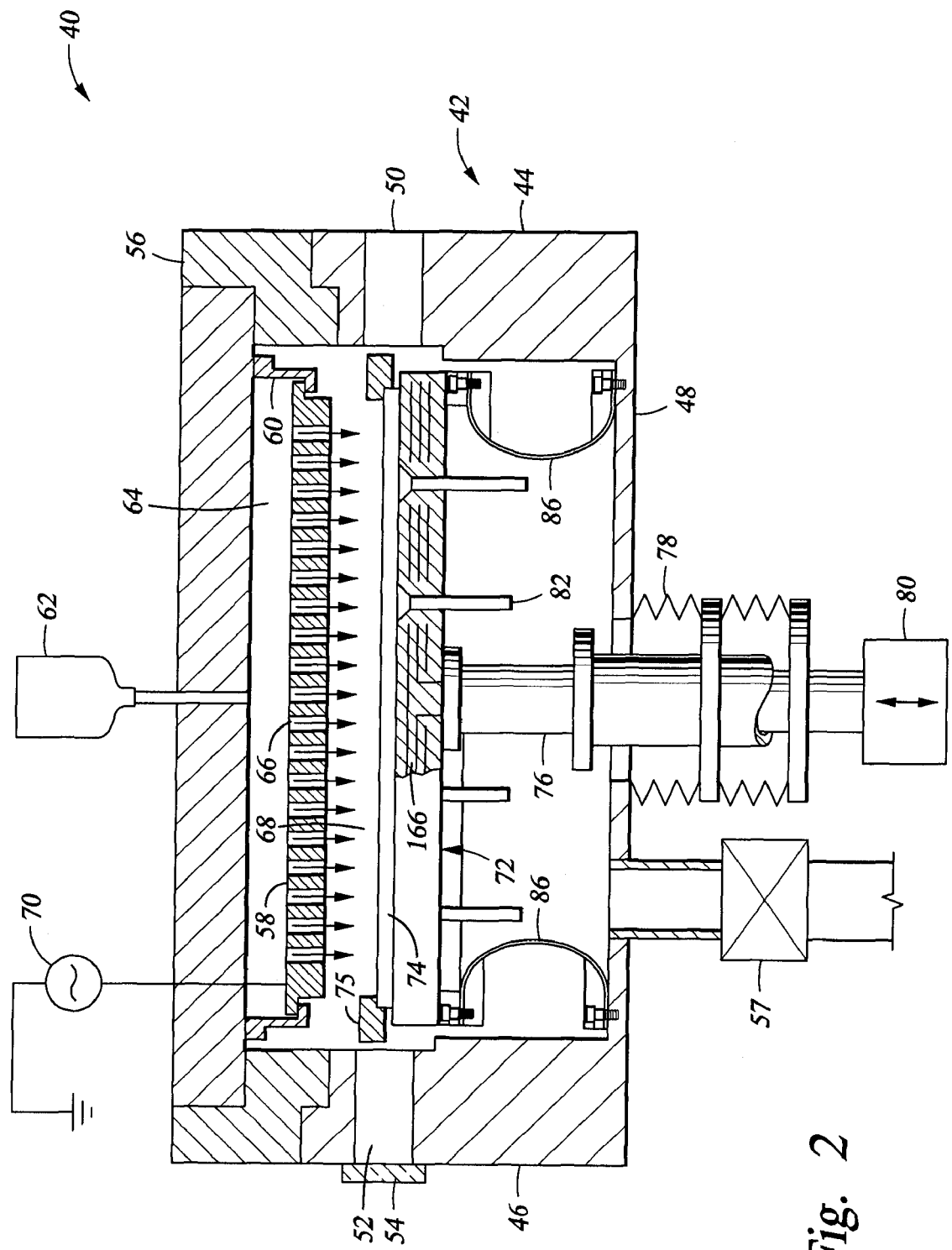
FIG. 2 is a cross-sectional view of a plasma processing chamber used for chemical vapor deposition and illustrating multiple peripheral grounding points.

An example of a large PECVD reactor 40 illustrated in the cross-sectional view of FIG. 2 includes a vacuum chamber 42 with opposing 44, 46 side walls integral with a bottom wall 48. The vacuum chamber 42 is metallic, typically aluminum, and electrically grounded. A loading port 50 formed in one sidewall 44 is connected to a central transfer chamber to allow a robot to transfer a panel into the vacuum chamber 42 on a transfer blade. An unillustrated slit valve selectively seals the loading port 50 during plasma processing. A view port 52 is formed in the opposed sidewall 46 and is sealed with a window 54 to allow viewing of the loading and processing of the panel. Window glass is typically a dielectric as opposed to the metal chamber walls. The other two unillustrated chamber sidewalls contain no large apertures significantly affecting the electrical conditions within the vacuum chamber 42. A lid assembly 56 is supported on and sealed to the vacuum chamber 42 but may be lifted from the vacuum chamber 42 for chamber maintenance. The lid assembly 56 is typically also electrically grounded. A vacuum pump 57 is connected the interior of the vacuum chamber 42 at its bottom to pump the chamber interior to the low Torr range.

A gas distribution plate or showerhead 58 is supported on the lid assembly 56 by hangers 60. A gas source 62 supplies processing gas to a manifold 64 formed between the showerhead 58 and the top of the lid assembly 56. A large number of gas holes 66 are formed over a wide area of the showerhead 58 to uniformly inject the processing gas into a processing region 68 within the vacuum chamber 42. At least the front of the showerhead 58 is metallic, typically made of aluminum, is electrically isolated from the lid assembly 56 and the vacuum chamber 42, and is electrically biased by an RF power supply 70. A susceptor 72 supports a panel 74 or other substrate during processing in opposition to the showerhead 58 across the processing region 68. Because the susceptor 72 supports a rectangular panel, it is also typically rectangular. A shadow ring 75 supported on the susceptor 72 overhangs the periphery of the panel 74 during deposition and may be used in some configurations to assure that the panel 74 is adjacent and juxtaposed to the susceptor 72. Blonigan et al. provide further details about the structure and components of the susceptor 72. The susceptor 72 is mounted on a central stem 76 sealed to the bottom wall 48 of the vacuum chamber 42 through a bellows 78 to allow a lift mechanism 80, such as a motor-driven worm drive, to vertically move the stem 76 and attached susceptor 72 between a loading position and a processing position. In the lower loading position, lift pins 82 project above the surface of the susceptor 72 to hold the panel 74 for transfer to and from the robot blade inserted through the loading port 50. The lift mechanism 80 then raises the susceptor 72 to lift the panel 74 off the lift pins 82 onto its upper support surface and further raise the susceptor 72 to the processing position at which the panel 74 closely opposes the showerhead 58.

The susceptor 72 includes a metallic layer that acts as a ground electrode in opposition to the RF biased showerhead 58. As a result, when the RF power supply 70 electrically biases the showerhead 58, it excites the processing gas in the processing area 68 between the two electrodes 58, 72 into an RF plasma, which activates the chemical reactions involved in chemical vapor deposition of the desired layer on the panel 74. To overcome the skin effect and other associated RF effects, multiple ground straps 86 are connected between the periphery of the susceptor 72 and the bottom wall 48 of the grounded vacuum chamber 42, which acts as a large RF return path to the RF power supply 70. The ground straps 86 need to be flexible to accommodate the vertical motion of the susceptor 72 between its two positions. The stem 76 is also grounded but its grounding is believed to primarily benefit the electrically shielding of electrical signal leads passing through it to thermocouples embedded in the susceptor 72, which is electrically heated to a closely controlled temperature. The ground straps 86 shunt the RF electrons directly to the chamber bottom wall 48 to thereby greatly shorten the grounding paths and to move the electrons away from the susceptor 72.

Figure 3:
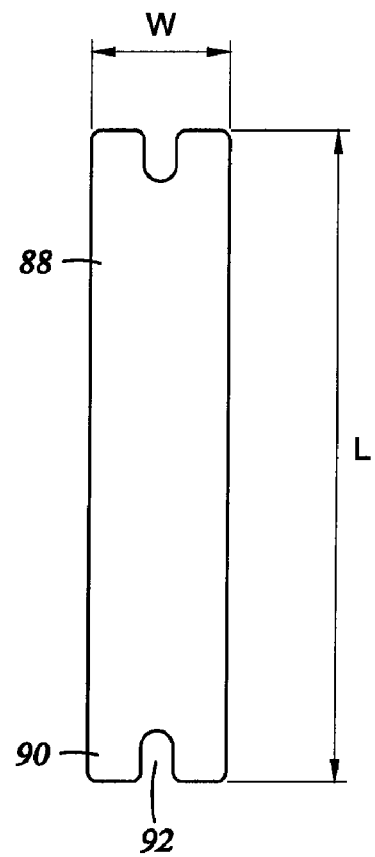
FIG. 3 is plan view of a standard ground strap.

A standard ground strap 88 is illustrated in the plan view of FIG. 3 in its flat undeployed condition. It has a width W for example of about 10 mm and a thickness of about 0.5 mm and is composed of a soft metal such as aluminum so that it is flexible and does not exert a significant restoring force when bent transversely to its thickness. The strap thickness is less than 10% of the strap width W but has relatively little effect on the RF conductance of the strap 88 as long as it is substantially greater than the skin depth. The length L of the strap 88 is selected in view of the maximum separation of the susceptor 72 and the chamber bottom wall plus the length of the end mounts and some curvature, for example, a length of about 400 mm. For most of its length, the standard ground strap 88 is an unpatterned strip. However, each end is formed with two mounting ears 90 forming between them an end slot 92 having a width closely fitting shanks of screws used to mount it.

Figure 4:
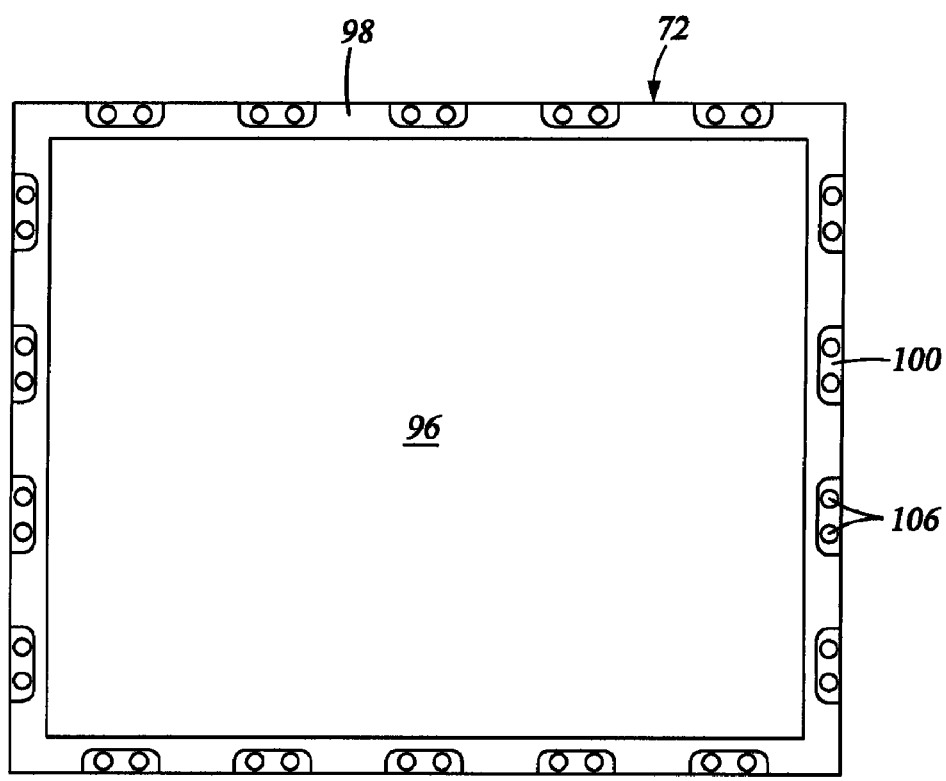
FIG. 4 is a plan view of a susceptor showing multiple peripheral grounding points.
Figure 5:
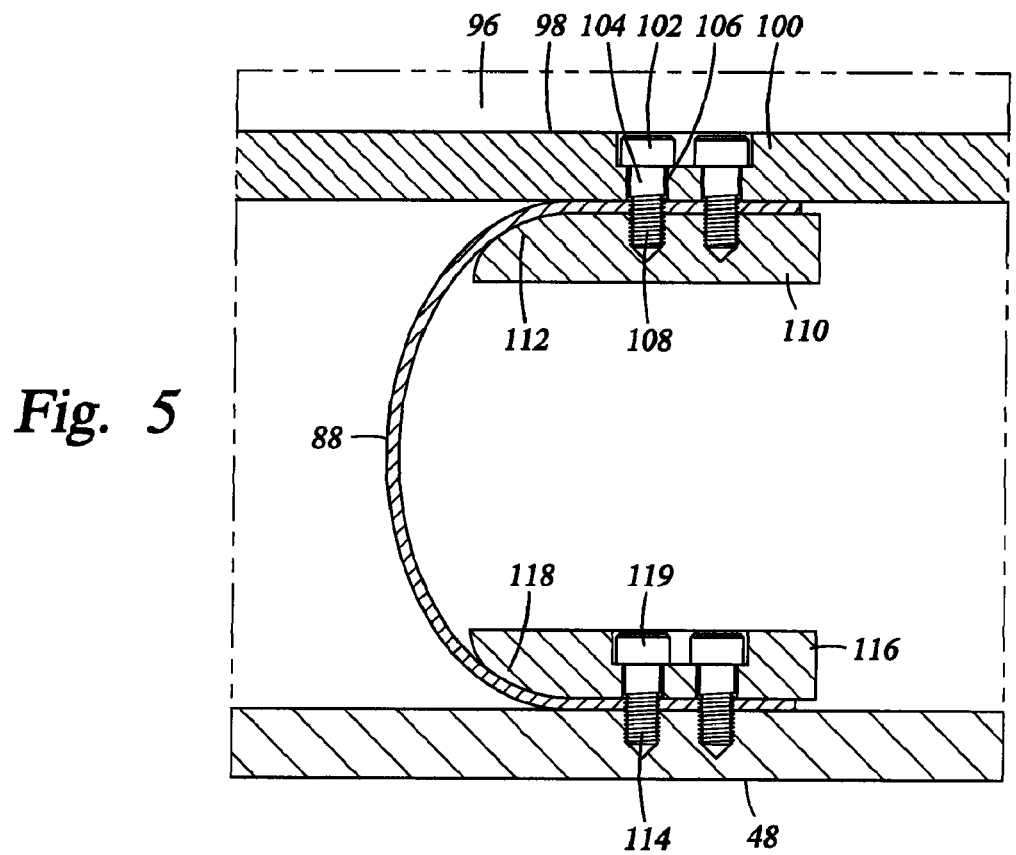
FIG. 5 is a partially sectioned view showing one ground strap connecting the periphery of the susceptor to the bottom chamber wall.

As shown in the top plan view of FIG. 4, the upper surface of the susceptor 72 is formed with a generally rectangular pedestal 96 of the same size as the panel to be supported on it. A depressed ledge 98 surrounds the pedestal 96 to support the base of the shadow ring which overhangs the periphery of the panel during processing. Generally rectangular recesses 100 are formed in the ledge 98 and are generally evenly spaced around the susceptor 72. They have depths accommodating, as illustrated in the sectioned side view of FIG. 5, heads 102 of two screws 104 passing through two pass holes 106 under each recess 100, which are used for mounting each of the ground straps 88. The screws 104 are screwed into tapped holes 108 in a shaped clamp 110 and in the region of the strap end slot 92 to capture the ears 90 and thus the upper end of the strap 88. The shaped clamp 110 has an pointed end 112 with a downwardly sloping upper side so the strap 88 is curving as it leaves its support. Similarly, tapped holes 114 are machined into the bottom wall 48 of the vacuum chamber 42. A second shaped clamp 116 with a pointed end 118 having an upwardly sloping side is secured by two screws 119 passing through the strap end slot 92 and through pass holes in the second clamp 116 and screwed into the tapped holes 114 of the chamber bottom wall 48 to capture a bottom end of the ground strap 88 between them.

The ground straps are electrically connected between the periphery of the susceptor and the grounded chamber body. The periphery of the susceptor is intended to include the outer lateral sides of the susceptor and the outermost portions of its top and bottom surfaces spaced from the sides within 10% or 20% of the distance from the sides to the center of the susceptor. It is also possible to connect the ground straps to the grounded chamber side walls 44, 46 rather than to the chamber bottom wall 48.

It has been found advantageous to position the ground straps 88 to substantially underlie the ledge 98 or periphery of the susceptor 72 and not to significantly underlie the pedestal 96 and supported panel 74, that is, to bend in the direction parallel to the associated edge of the rectangular susceptor 72. This sideward facing orientation, contrary to that of FIG. 2 in which the straps 86 are illustrated as bending towards the middle of the susceptor 72, avoids interference with the lift pins 82 and keeps the grounding current away from the bottom of the susceptor 72.

Figure 6:
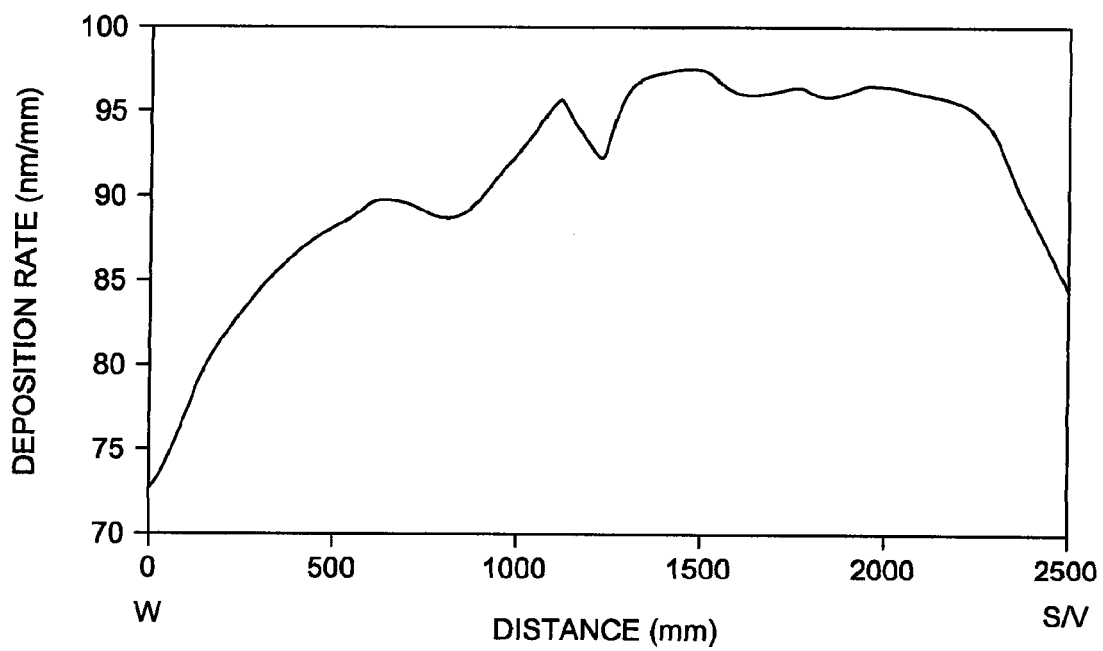
FIG. 6 is a graph showing a profile of deposition rate using symmetric peripheral grounding.

However, even fifty ground straps do not seem to solve the uniformity problem. In particular, typically the deposition profile along the centerline between the loading port 50 (hereafter referred to as the slit valve or S/V) and the window port 50 (hereafter referred to as the window or W) varies in an asymmetric pattern illustrated in the graph of FIG. 6 for the deposition rate of silicon nitride. The deposition rate using the standard ground straps exhibits a strong maximum near the center and asymmetric decreases towards the window and slit valve. The data generally shows a greater deposition on the side nearer the slit valve. Choi et al. in U.S. patent application Ser. No. 11/389,603, filed Mar. 23, 2006 and now published as U.S. published patent application 2007/0221128, have disclosed similar deposition non-uniformities but have taken a different approach to improve the uniformity.

We have determined that an asymmetric grounding arrangement affects the deposition profile and can reduce the asymmetric deposition profile. Although we are not bound by our understanding of the theory of the invention, we believe that the loading port and associated slit valve introduce a major asymmetry into the electromagnetic fields, which requires asymmetric grounding to compensate for the asymmetric electromagnetic fields. We now believe that the view port of itself does not introduce further asymmetry but it is used as a reference point in describing the chamber to which the invention has been applied.

One embodiment of the invention can be applied to the symmetric positioning of ground straps indicated by the even spacing of the recesses 100 in FIG. 4. However, different types of ground straps connect different portions of the susceptor to ground to achieve asymmetric grounding.

A wide ground strap 120 illustrated in the plan view of FIG. 7, has a width W substantially greater than that of the standard ground strap 88 of FIG. 3. For example, its width W may be 50 mm, more than four times that of the standard ground strap 88. However, its length L may be the same. It has wider ears 122 than the ears 90 of FIG. 3 located on each side of an end slot 124 that has about the same width as the previously described end slot 92. As a result, the wide ground strap 120 may have ends clamped by the same clamping mechanism of FIG. 5 and be substituted for the standard symmetric ground strap 88 without modifying the susceptor 72 or the clamping hardware. It can be assumed that the wide ground strap 120 has increased electrical conductance even at RF frequencies in proportion to its increased width. The wide ground strap 120 has a different shape from the standard ground strap 88 because it fills a differently sized outline even though its overall features are functionally similar in many respect.

The wide ground strap 120 may conveniently have the same thickness and be made of the same material as the standard ground strap 88. However, the increased width may decrease its flexibility or the conductance of the ground strap may need to be somewhat reduced. Accordingly, apertured ground straps 126, 128 illustrated in the plan views of FIGS. 8 and 9 may have the same outer shapes as the standard or wide ground strap 88, 120 but include respectively a slit aperture 130 or a diamond aperture 132, both centrally located along the medial longitudinal axes. The widths of the apertures 130, 132 may be 30 mm for 50 mm-wide straps. The apertures 130, 132 reduce the mechanical strength in the middle of the straps 126, 128 and thereby increase the strap flexibility. Alternatively, a necked ground strap 134 may have one flat side but have a recess 136 cut into the other side, thereby forming a neck 138 having a width of 30 mm for a 50 mm-wide strap. The necked strap 134 also exhibits increased flexibility. Other forms of necked and other shaped straps of reduced cross section in the middle are apparent to the designer. The apertures and necks affect the strap conductance, but if the apertures and recesses are limited to a relatively small middle portion of the axial length, the strap's conductance should not be greatly reduced while at least the middle portion can easily bend to accommodate the vertical motion of the susceptor. The apertured and necked ground straps 126, 128, 130, 132 may or may not fill the same general outline of the standard ground strap 88 but have different shapes than it because of the geometric features introduced into them.

An offset wide ground strap 140, illustrated in the plan view of FIG. 11, includes a narrow ear 142 and a wide ear 144 forming an end slot 146 between them. The end slot 146 is offset from a medial longitudinal axis 148 of the strap 140 while the end slots 124 of the previous embodiments are illustrated as being symmetric with the medial longitudinal axis. The width of the narrow ear 142 corresponds approximately to the distance between the mounting screws 102, 119 and outer periphery of the ledge 98 of the susceptor 72. Advantageously, the width of the narrow ear 142 is the same as the symmetric ears 90 of the standard ground strap 88 of FIG. 3 to allow the substitution of the wider asymmetric ground strap for the narrower symmetric one with the same clamping hardware. This design has the advantageous capability of being mounted on the susceptor 72 in two different orientations depending on which side of the strap 140 is mounted next to the susceptor 72. In one orientation, the mounted strap 140 lies almost completely inwardly from the edge of the susceptor 72. In the other orientation, a substantial portion of the mounted strap 140 lies extends outwardly from the edge of the susceptor 72.

The form of the ground or electrical straps is not limited to those shown. Blonigan et al. have disclosed in the previously cited patent a wide curtain strap having a limited number of flexible joints joining more rigid sections. The planar form of straps is not required but does promote flexibility. Braided straps are possible but introduce problems in vacuum pumping.

Figure 12:
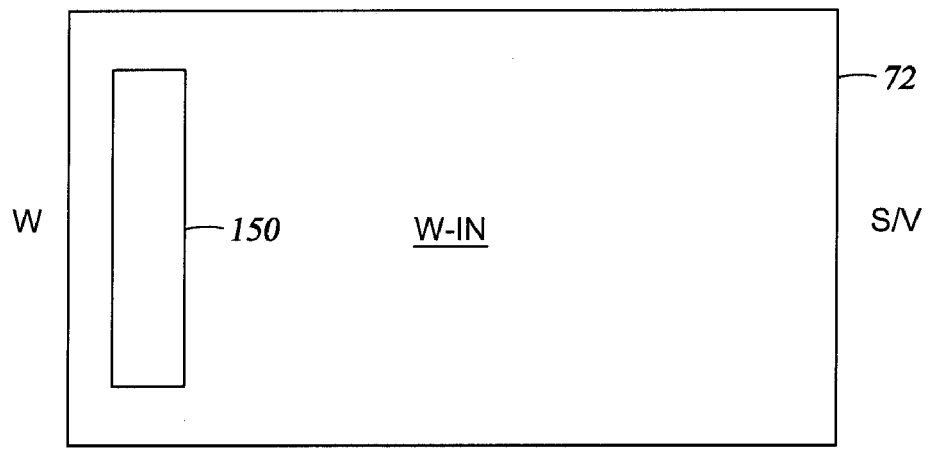
FIGS. 12, 13, and 14 are plan views schematically illustrating three embodiments of asymmetrically grounding a rectangular susceptor.
Figure 13:
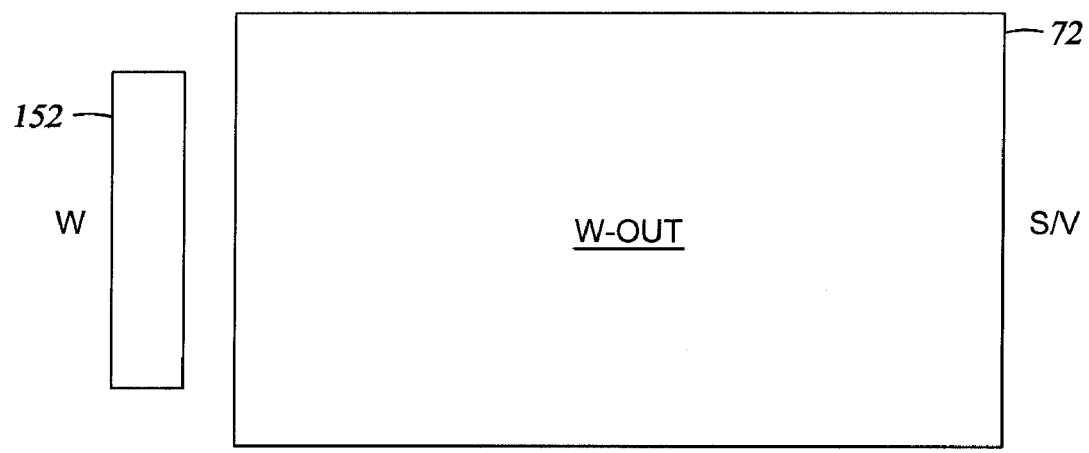

We have found that the deposition uniformity can be improved by mounting differently shaped ground straps at different positions around the periphery of the susceptor. In the standard or conventional configurations, all ground straps are the narrow ground straps 88 of FIG. 3. Various asymmetric configurations have been tried. In one configuration, labeled W-IN and schematically illustrated in the plan view of FIG. 12, 50-wide offset ground straps 140 of FIG. 11 are mounted as generally indicated by an inside area 150 along the entire side of the susceptor 72 adjacent the view port 52 and the window 54. Further, they are mounted with their wide sides on the inside of the susceptor 72. In the W-IN configuration, standard 10 mm-wide ground straps 88 are mounted on the remaining three sides of the susceptor 72. In a closely related but distinct configuration, labeled W-OUT and schematically illustrated in the plan view of FIG. 13, 50-wide offset ground straps 140 are mounted as generally indicated by an outside area 152 along the entire of the susceptor 72 adjacent the window 54 and view port 52. However, unlike the W-IN configuration, they are mounted with their wide sides on the outside of the susceptor 72 so that they partially overhang the susceptor periphery. Again, standard 10 mm-wide ground straps 88 are mounted on the remaining three sides. In view of the generally small size of the view port 52, it is likely that the principal effect of this configuration is to place extra grounding on the side opposite the loading port 50. Both the illustrated configurations can be modified so that the extra grounding extends only along part of the window side.

Figure 14:
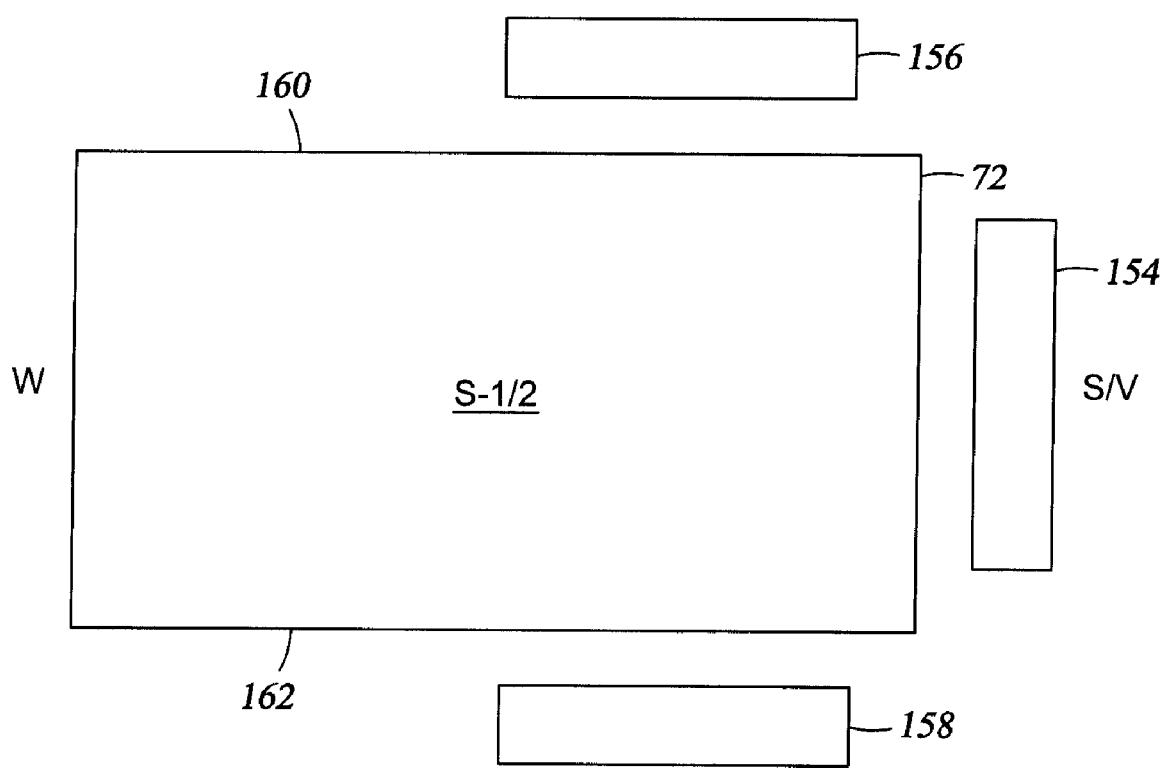

In another configuration, labeled S-1/2 and schematically illustrated in the plan view of FIG. 14, 50 mm-wide offset ground straps 140 are mounted as indicated by an end area 154 along the entire side of the susceptor 72 adjacent the slit valve and loading port 50 and also as indicated by side areas 156, 158 along the half of the perpendicular sides 160, 162 of the susceptor 72 nearer the slit valve. In this embodiment, all the ground straps 140 are mounted with their wide side on the outside of the susceptor 72. Standard 10 mm-mm wide ground straps 88 are mounted on the remaining side areas of the susceptor 72. The illustrated S-1/2 configuration can be modified in a number of ways such as the extra grounding extending along less or more than half of the perpendicular sides 160, 162. In a more complex modification, the extra grounding on the perpendicular sides 160, 162 is not uniform but gradually tapers from a large extra grounding near the window side to no extra grounding toward the slit valve side. Yet other configurations of asymmetric grounding are possible.

Figure 15:
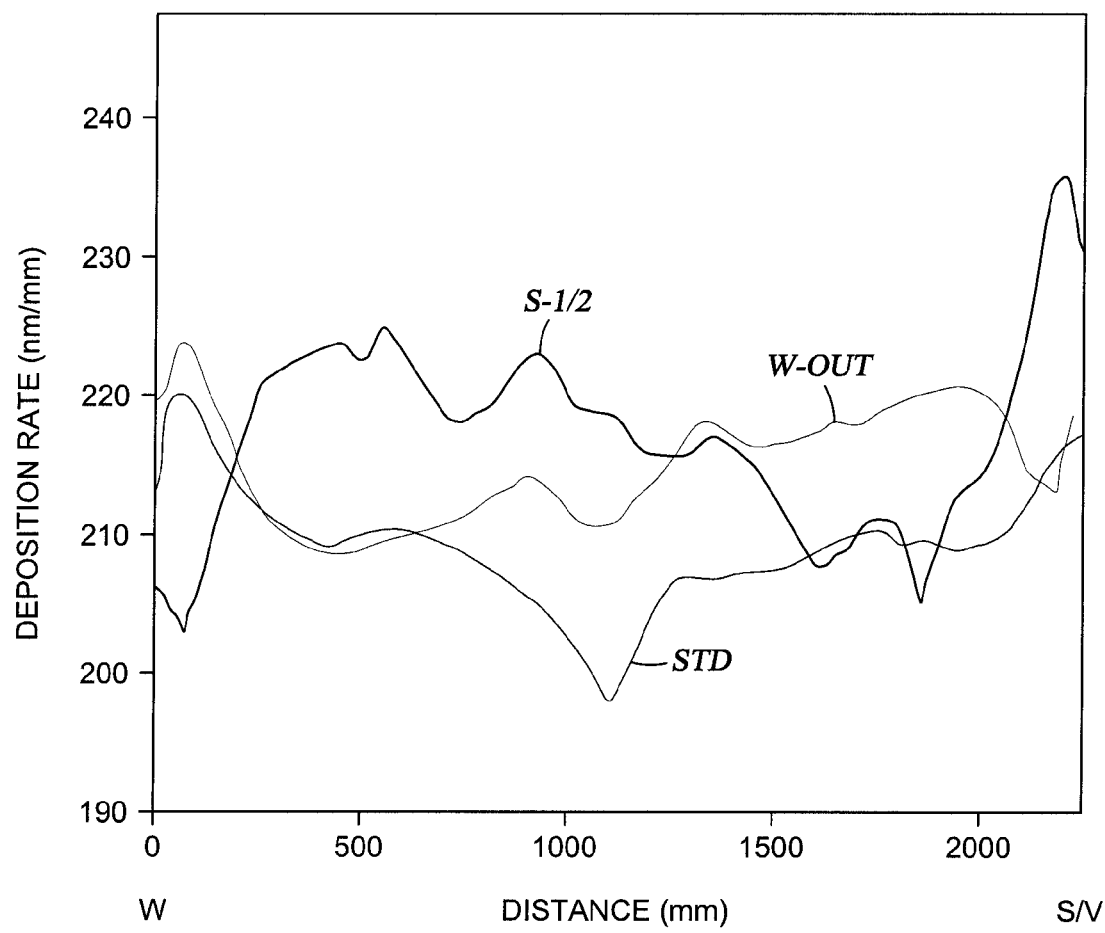
FIG. 15 is a graph illustrating the deposition profiles for a conventional symmetric grounding of the susceptor and for the two embodiments of FIGS. 13 and 14 of asymmetrically grounding the susceptor.

Three grounding configurations were used with otherwise the same chamber conditions to deposit a film of hydrogenated silicon nitride. The thickness of the deposited film was measured on the medial line between the window and slit valve side of the panel. The profiles of depositions rates are shown in the graph of FIG. 15. The standard configuration STD using all 10 mm-wide ground straps exhibits a minimum in deposition rate near the center and increases toward the sides. The W-OUT configuration in which wider ground straps were placed on the window side exhibits generally higher and somewhat flatter deposition rate but with a somewhat higher deposition on the slit valve side. The S-1/2 configuration in which wider ground straps were placed in the half of the pedestal nearer the slit valve side exhibits one narrow peak but a wider valley in deposition rate on the window side and a narrow valley but a wider peak on the window side. The asymmetry of the results for the S-1/2 configuration is the reverse of what was expected.

The extra asymmetric grounding capacity seems to generally increase the deposition. One measure for explaining this result sums the widths of all the grounding straps being used to calculate an effective grounding conductance. Fifty 10 mm-wide standard straps have a total width of 500 mm. If the W-OUT configuration includes 38 10 mm-wide standard straps and 12 50 mm-wide standard straps, the total width is 980 mm producing twice the conductance of the STD configuration. The S-1/2 configuration has an equal number of standard and wide straps for a total width of 1500 mm producing three times the conductance of the STD configuration.

Although the asymmetric grounding in the S-1/2 configuration significantly increases the deposition asymmetry, the experiments demonstrated that the deposition asymmetry can be controlled. However, the experiments were based on extreme cases of grounding asymmetry. More refined adjustments in the amount of grounding should reduce resultant deposition asymmetry while compensating for deposition asymmetry produced by the standard configuration.

The experiments support a conclusion that extra grounding on one side increases the deposition rate on the other side.

For commercial production, deposition rate and its uniformity are not the only considerations. Film quality and its uniformity must also be considered. FIGS. 16, 17, and 18 represent three measures of film quality for the hydrogenated silicon nitride films grown with the three discussed configurations. The boxes contain measured values of fraction of silicon-hydrogen bonds, stress, and wet etch rate measured at the middle, on the four sides, and at two corners of the panel. The uppermost value is for the STD ground strap configuration, the middle value is for the W-OUT configuration, and the lowermost value is for the S-1/2 configuration. The hydrogen fraction in the hydrogenated silicon is represented in FIG. 16. Generally, a low hydrogen fraction is desired. Stress in the film is represented in FIG. 17. Generally, low stress is desired whether compressive or tensile. The wet etch rate (WER) is represented in FIG. 18. Generally, a high wet etch rate indicates a poor quality film quality so a low WER is desired.

Figure 19:
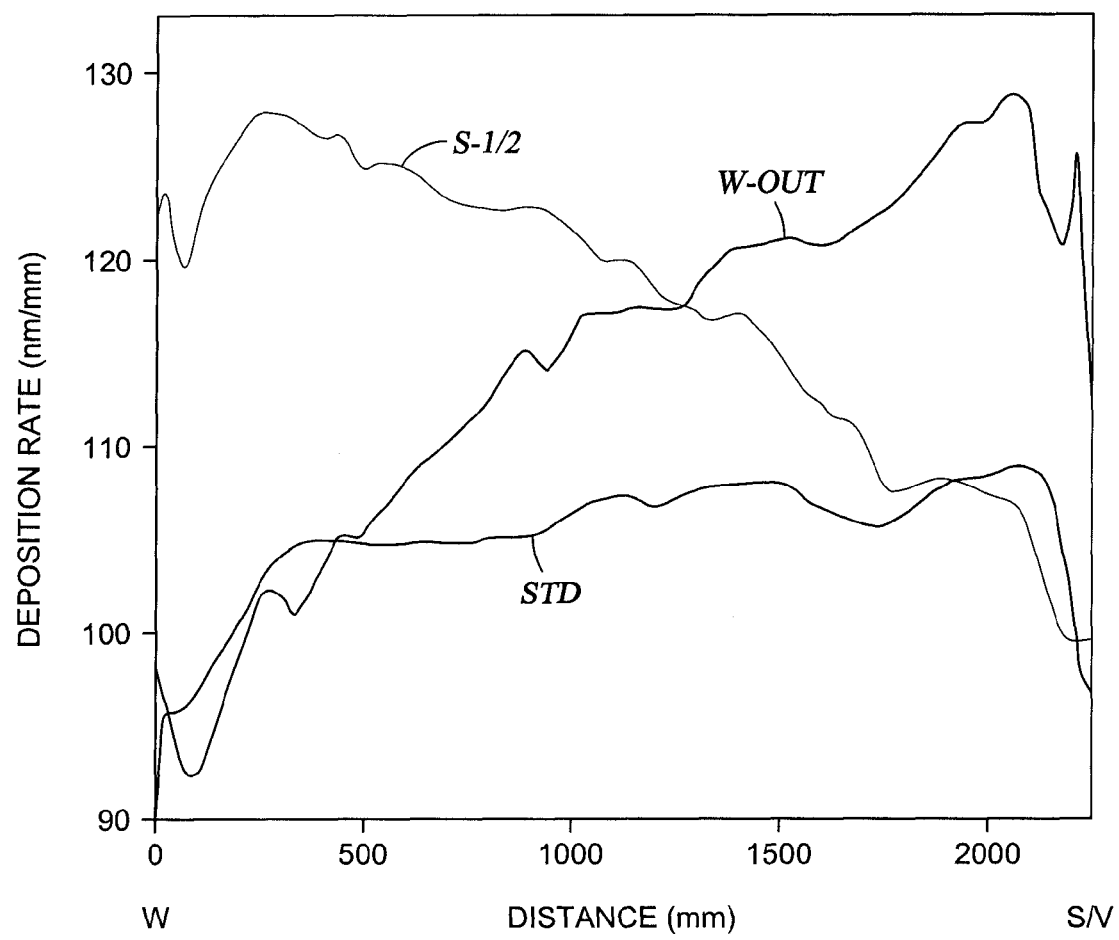
FIG. 19 is a graph similar to FIG. 15 illustrating deposition profiles for the same grounding configurations but a different deposition process.

Results for different processes show significantly different results from those of FIGS. 15-18. For example, a different set of conditions for PECVD of SiN:H produce the deposition profiles illustrated in the graph of FIG. 19 for the standard, W-OUT, and S-1/2 grounding configurations. These results more clearly demonstrate that additional grounding of one side of the chamber depresses the deposition rate on that side but increases it on the opposed side.

From the above results, we believe the S-1/2 grounding configuration offers the most promise. Work is continuing to establish the best grounding configurations for the process of interest. Importantly, however, it has been demonstrated that grounding asymmetry can compensate and at least partially correct deposition asymmetry introduced by chamber asymmetry.

Figure 20:
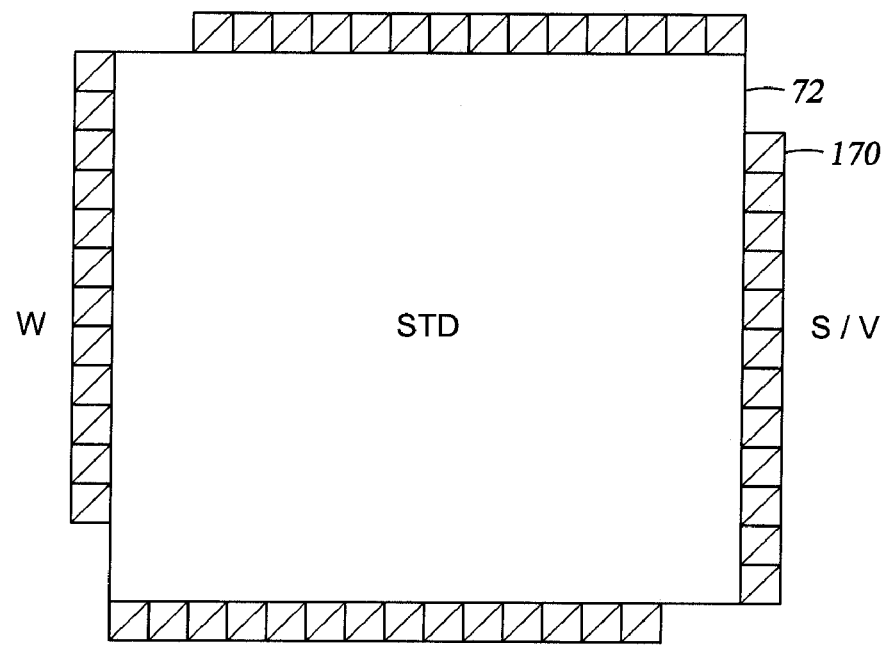
FIG. 20 is a plan view illustrating symmetrically grounding a rectangular susceptor.

More detailed experiments with more complex distributions have shown demonstrated further improvements. A standard, uniform distribution of grounding straps is illustrated in the plan view of FIG. 20 in which each single-hatched box represents a 20 mm-wide ground strap 170 or more particularly its grounding point on the susceptor 72. There are twelve ground straps 170 on one set of two opposed sides and fourteen ground straps 170 on the other set of two opposed perpendicular sides reflecting the somewhat non-square shape of the susceptor 170. There are thus a total of fifty-two ground straps 170. As illustrated the grounding points of the ground straps 170 are evenly distributed along the respective sides but are offset from one respective corner. The offset accommodates the large bending of the flexible ground straps which may extend over several grounding points in a distorted S-shape. The grounding points on the floor of the metal vacuum chamber may be offset from the corresponding grounding points on the susceptor 72. Also, the flexible grounding straps allow the chamber grounding points to be located on the lower sidewalls of the metal vacuum chamber.

Figure 21:
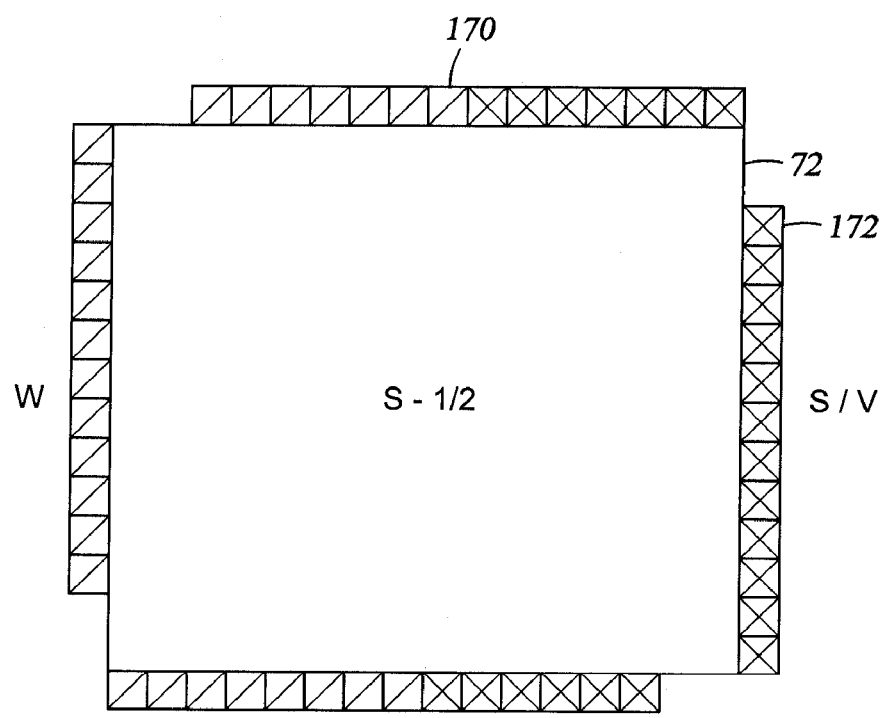
FIGS. 21 and 22 are plan views illustrating two embodiments of asymmetric grounding of the rectangular susceptor.

An asymmetric S-1/2 distribution of ground straps is illustrated in the plan view of FIG. 21 in which each double-hatched box represents a 50 mm-wide ground strap 172 on the side of the susceptor facing the slit valve and on half of the opposed perpendicular sides of the susceptor walls nearer the slit valve. The 50 mm-wide ground strap may be of the asymmetric shape of the ground strap 140 of FIG. 11, preferably with its wide side overhanging the side of the susceptor 72. On the other hand, the 20 mm-wide ground straps 170 remain on the side of the susceptor 72 opposite the slit valve and on half of the opposed perpendicular sides of the susceptor 72 farther from the slit valve.

Figure 22:
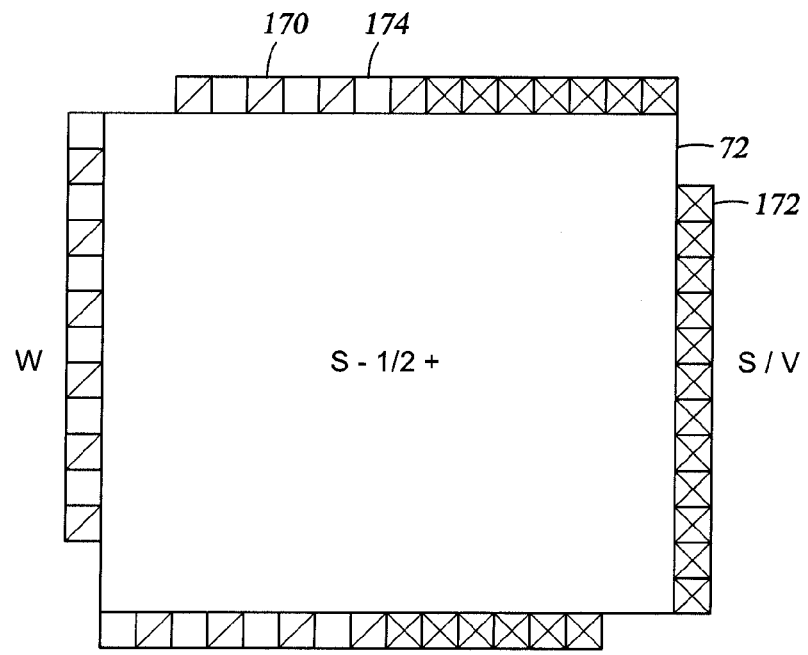

An even more asymmetric S-1/2+ distribution of ground straps is illustrated in the plan view of FIG. 22 in which each empty box represents the absence of any ground strap at that evenly distributed grounding point that is, a null ground strap 174. Compared to the S-1/2 distribution half or approximately half of the 20 mm ground straps are removed from the side of the susceptor opposite the slit valve and on the portions of the opposed perpendicular sides farther from the slit valve and only half the number of 20 mm ground straps 170 remain, but the grounding points nearer the slit valve remain fully populated with 50 mm ground straps 172.

Figure 23:
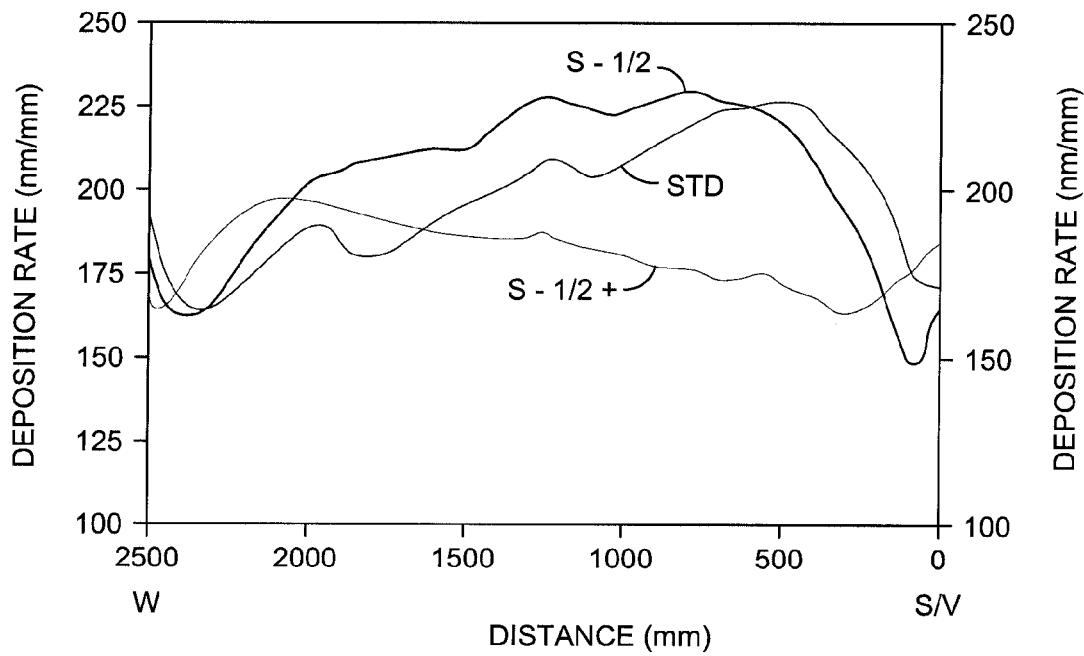
FIG. 23 is a graph illustrating deposition profiles for the three grounding configurations of FIGS. 20-22.

The three different grounding configurations were tested using the same process recipe for depositing $SiN_x$ in a PECVD process which uses a higher power than the process for hydrogenated silicon. Profiles for deposition rates across the panel for the three grounding configurations are illustrated in the graph of FIG. 23. The standard (STD) configuration of FIG. 20 with uniform grounding shows a strong but wide deposition peak on the side of the slit valve. The asymmetric S-1/2 configuration of FIG. 21 shows a broader deposition peak extending over the middle of the panel but with significant valleys near both the slit valve and the opposed window. The even more asymmetric S-1/2+ configuration of FIG. 22 shows a more uniform deposition profile. Further optimization of the grounding configuration is possible.

Figure 24:
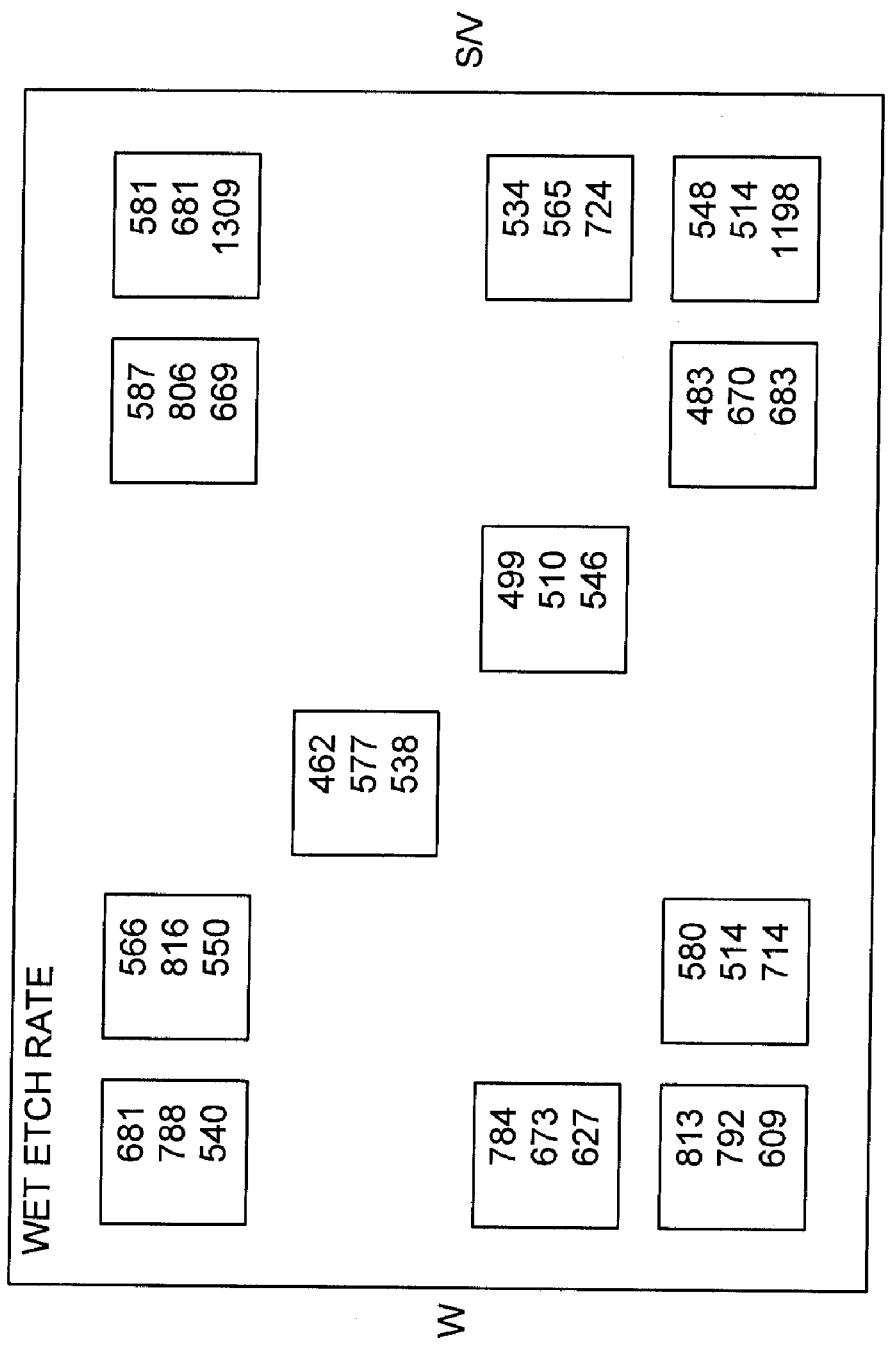
FIG. 24 is a map illustrating the distribution around the panel of the set etch rate for the three grounding configurations of FIG. 20-22.

The distribution of film properties is also important. The map of FIG. 24 shows values of the wet etch rate in units of angstroms (0.1 nm) per minute at twelve positions on the panel for the three grounding configurations of FIGS. 20-22. Each box contains values at that point from the top down for STD, S-1/2, and S-1/2+ grounding configurations. The results will not be discussed in any detail beyond stating that the grounding configuration does affect the wet etch rate and that the wet etch rate varies in a two-dimensional pattern over the panel. Similar data can be obtained for film properties of sheet resistance, stress, and Fourier transform infrared spectroscopy (FTIR) measuring the concentration of Si—H and N—H atomic bonds. Such detailed data allows the selection of the optimized grounding configuration for a particular application of the CVD apparatus.

The invention is not limited to two types of evenly spaced grounding evenly distributed within two respective zones. More than two different types of grounding straps may be used and different grounding straps may be distributed within three or more zones. The grounding asymmetry may be achieved in different ways than in the described embodiments which place different electrical straps in different ones of the evenly spaced grounding locations. Similar results can be achieved by varying the distribution of grounding locations around the periphery of the susceptor, that is, adding and reducing the number of ground straps from the standard configuration of evenly spaced and identical ground straps. That is, the distribution and spacing between ground straps may be varied to produce the desired grounding asymmetry. In the uneven distribution, the ground straps may be the same or be of different types.

The invention is not limited to the non-uniformities introduced by the slit valve and possibly the opposed window. In view of the relatively small size of the window, it is possible that the loading port associated with the slit valve alone causes the observed non-uniformities requiring compensation. Further, the view port or other asymmetric chamber structure may be located on a wall perpendicular to the slit-valve wall, perhaps requiring grounding that is asymmetric with respect to perpendicular medial lines of the pedestal.

The asymmetric grounding may be used to compensate for chamber asymmetries other than the window and slit valve. For example, other types of discontinuities may be formed in the metallic chamber walls, especially dielectric members. Even a non-square susceptor introduces asymmetries within the chamber. Also, the grounding may vary along the rectangular sides of the susceptor in view of the distance from the center of the susceptor.

The invention is most useful for a large rectangular susceptor in which corner rounding is limited to less than 10% of the length of a side of the susceptor or other minor non-square features of such small size. However, round susceptors used for wafers of 300 mm and larger may benefit from the use of asymmetric peripheral grounding because such chambers also typically include a wafer port and slit valve on one side of a generally tubular wall.

The flexibility of the ground straps accommodates the vertical movement of the susceptor. If the susceptor does not move, the straps need not be flexible. The required degree of grounding asymmetry depends upon the deposition asymmetry or other effect being compensated. The described embodiments vary the grounding conductance by about a factor of four over the entire sides adjacent the window and slit valve and over half of the perpendicular walls. Less asymmetry may be required. One definition is that at least half of one susceptor edge has a total grounding conductance that differs by a factor of at least 50% or at least 100% from that of another equally sized susceptor edge portion.

Although the invention has been described for a plasma chamber in which the susceptor and showerhead both extend horizontally in parallel to the ground, similar asymmetric grounding may be applied to plasma chambers in which the susceptor and showerhead are arranged vertically or at least significantly tilted from the horizontal. As a result, the susceptor does not completely support the panel but is designed to be adjacent and closely juxtapose it and electrically coupled to it to determine its electrical potential. Further, the lift mechanism in such a vertical arrangement moves substantially horizontally to and from the opposed electrode rather than strictly lifting the panel. Also, in such a vertical arrangement, structural asymmetries may arise from the structure partially supporting the panel on its bottom edge.

Although the invention has been described in the context of ground straps connected to a body at zero potential, asymmetrical electrical straps may be connected to a fixed non-zero potential or to a varying potential. In particularly, the invention may be applied to plasma etching chambers in which typically the showerhead is grounded and the susceptor is RF powered so that multiple electrical straps connect the susceptor periphery to the RF power supply.

The invention allows improved uniformity and film quality with simple modifications to inexpensive and easily fabricated grounding straps. Further, the modifications to chamber grounding can be made in the field and be customized for different processes.

The invention claimed is:

1. A plasma processing chamber, comprising:
a chamber including sidewalls and a back wall;
a first electrode within the chamber;
a susceptor assembly disposed within the chamber and including a second electrode opposed to the first electrode and configured to be juxtaposed to a rectangular substrate to be processed; and
a plurality of electrical straps fixed to a periphery of the second electrode and connecting the periphery to a body at a predetermined electrical potential and producing an asymmetric grounding conductance to the body around the periphery.

2. The chamber of claim 1, further comprising a movement mechanism connected to the second electrode to move it towards and away from the first electrode.

3. The chamber of claim 2, wherein the electrical straps are flexible and bend in response to movement of the second electrode.

4. The chamber of claim 1, wherein the chamber is electrically grounded and comprises the body.

5. The chamber of claim 1, wherein the electrical straps connected to the periphery of the second electrode have a plurality of shapes.

6. The chamber of claim 1, wherein the second electrode is rectangular and has a side of at least 1 m.

7. The chamber of claim 6, wherein an RF power source operating at a frequency of at least 13 MHz is connected to the first electrode.

8. The chamber of claim 1, wherein the first electrode includes a plurality of gas distribution apertures extending therethrough and connectable to a gas source.

9. The chamber of claim 1, further comprising a plurality of threaded members screwed into tapped holes in the susceptor assembly, capturing respective ones of the electrical straps, and thereby fixing the electrical straps to the periphery of the second electrode.

10. The chamber of claim 9, wherein the threaded members are screws.

11. The chamber of claim 9, wherein the susceptor assembly includes a plurality of clamp members having the tapped holes formed therein and wherein ends of the electrical straps are captured between the clamp members and the second electrode.

12. A plasma processing chamber, comprising:
a vacuum chamber including sidewalls and a back wall;
a first electrode within the chamber;
a second electrode within the chamber, opposed to the first electrode, and configured to be juxtaposed to a substrate to be processed; and
a plurality of electrical straps of a plurality of shapes fixed to a periphery of the second electrode and connecting the periphery to a body at a predetermined electrical potential.

13. The chamber of claim 12, wherein the chamber includes the body.

14. The chamber of claim 12, further comprising a lift mechanism connected to the second electrode to move it towards and away from the first electrode and wherein the electrical straps are flexible and bend in response to movement of the second electrode.

15. The chamber of claim 12, wherein the electrical straps are evenly distributed about a periphery of the second electrode.

16. The chamber of claim 12, wherein the plurality of shapes includes a plurality of widths of the straps.

17. A plasma processing chamber, comprising:
a chamber including sidewalls and a back wall;
a first electrode within the chamber;

a second electrode within the chamber, opposed to the first electrode, and configured to be juxtaposed to a substrate to be processed; and a plurality of electrical straps unevenly distributed around a periphery of the second electrode, fixed to the periphery, and electrically connecting the periphery to a body at a predetermined electrical potential.

18. The chamber of claim 17, further comprising a lift mechanism connected to the second electrode to move it towards and away from the first electrode and wherein the electrical straps are flexible and bend in response to movement of the second electrode.

19. The chamber of claim 17, wherein the electrical straps have a plurality of respective shapes.

20. The chamber of claim 17, wherein the second electrode includes a plurality of grounding points evenly distributed along at least portions of four peripheral sides of the second electrode and each capable of being connected to one of the electrical straps, wherein the electrical straps are connected to only some of the grounding points and others of the grounding points are not connected to electrical straps.

21. A plasma enhanced CVD chamber, comprising:
a vacuum chamber including an electrically grounded wall;
a showerhead electrode disposed in the vacuum chamber and having a plurality of gas distribution holes therethrough;
an RF power source connected to the showerhead electrode and operating at a frequency of at least 13 MHz;
a support assembly including a rectangular susceptor disposed in the chamber and configured to be juxtaposed to a rectangular panel to be processed;
a movement mechanism for moving the support assembly towards and away from the showerhead electrode; and
a plurality of flexible grounding straps fixed to a periphery of the susceptor, connected between the periphery and the electrically grounded wall, and producing an asymmetrical conductance between the susceptor and the wall which varies around the periphery.

22. The CVD chamber of claim 21, wherein different ones of the plurality of straps are formed with different shapes.

23. The CVD chamber of claim 21, wherein the grounded wall is a back wall of the vacuum chamber on a side of the susceptor opposite the showerhead.

24. The CVD chamber of claim 21, wherein the asymmetrical conductance is chosen to produce a more uniform deposition upon the panel in a CVD process.

25. The CVD chamber of claim 21, further comprising a plurality of threaded members screwed into tapped holes in the support assembly and thereby capturing respective ones of the grounding straps and fixing the grounding straps to the periphery of the susceptor.

26. The CVD chamber of claim 25, wherein the support assembly further includes a plurality of clamp members in which the tapped holes are formed and wherein the grounding straps are captured between the susceptor and the clamp members.

27. The CVD chamber of claim 25, wherein the threaded members are screws.

28. A plasma processing chamber, comprising:
a chamber including sidewalls and a back wall;
a first electrode within the chamber;
a susceptor assembly disposed within the chamber and including a second electrode opposed to the first electrode, configured to be juxtaposed to a rectangular substrate to be processed, and having two opposed and parallel linearly extending peripheral first sides and two opposed and parallel linearly extending peripheral second sides perpendicular to the first sides;
a plurality of first electrical straps non-uniformly arranged along the first sides, each of which is fixed to a respective one of the first sides of the second electrode, and connecting the first sides to a body at a predetermined electrical potential; and
a plurality of second electrical straps connecting the second sides of the second electrode to the body.

29. The chamber of claim 28, wherein the first electrical straps are arranged along the first sides in a common non-uniform arrangement between a first one and a second one of the first sides.

30. The chamber of claim 28, wherein the second electrical straps are arranged in respective uniform arrangements along the second sides.

31. The chamber of claim 28, further comprising a movement mechanism connected to the susceptor assembly to move it towards and away from the first electrode and wherein the first and second electrical straps are flexible and bend in response to movement of the susceptor assembly.

32. The CVD chamber of claim 28, further comprising a plurality of threaded member threaded into tapped holes in the susceptor assembly and thereby capturing respective ones of the first and second electrical straps.

33. The CVD chamber of claim 32, further comprising a plurality of clamp members in which the tapped holes are formed and capturing the first and second electrical straps against the second electrode.

34. The CVD chamber of claim 28, further comprising a plurality of screws threaded into tapped holes in the susceptor assembly and thereby capturing respective ones of the first and second electrical straps.

35. A plasma processing chamber, comprising:
a chamber including sidewalls and a back wall;
a first electrode within the chamber;
a second electrode within the chamber, opposed to the first electrode, configured to be juxtaposed to a rectangular substrate to be processed, and having four peripheral linearly extending and rectangularly arranged sides; and
a plurality of electrical straps each of which is fixed to a respective one of the four sides and is connected to the respective one of the four sides and to a body at a predetermined electrical potential, wherein all four sides are connected by respective ones of the electrical straps to the body, and wherein the electrical straps are non-uniformly arranged along a path including the four sides.

36. A plasma processing chamber, comprising:
a chamber;
a first electrode within the chamber;
a second electrode within the chamber, opposed to the first electrode, configured to be juxtaposed to a rectangular substrate to be processed, and having four peripheral linearly extending and rectangularly arranged sides; and
a plurality of electrical straps each of which is connected to a respective one of the four sides at a bottom side of the second electrode opposite the first electrode and to a body at a predetermined electrical potential, wherein all four sides are connected by respective ones of the electrical straps to the body, and wherein the electrical straps are non-uniformly arranged along a path including the four sides.

37. The chamber of claim 36, further comprising a plurality of screws fixing respective ones of the electrical straps to the bottom side of the second electrode.

* * * * *